United States Patent [19]

Tamura et al.

[11] Patent Number: 4,565,584
[45] Date of Patent: Jan. 21, 1986

[54] METHOD OF PRODUCING SINGLE CRYSTAL FILM UTILIZING A TWO-STEP HEAT TREATMENT

[75] Inventors: Masao Tamura, Tokorozawa; Makoto Ohkura, Hachioji; Masanobu Miyao, Tokorozawa; Nobuyoshi Natsuaki, Kodaira; Naotsugu Yoshihiro, Matsudo; Takashi Tokuyama, Higashikurume; Hiroshi Ishihara, Ohta, all of Japan

[73] Assignee: Hitachi, Ltd., Tokyo, Japan

[21] Appl. No.: 460,801

[22] Filed: Jan. 25, 1983

[30] Foreign Application Priority Data

Jan. 29, 1982 [JP] Japan ................................. 57-11635

[51] Int. Cl.$^4$ .................. H01L 21/263; H01L 21/205
[52] U.S. Cl. .................................. 148/1.5; 29/576 E; 29/576 T; 29/578; 148/174; 148/175; 148/DIG. 1; 148/DIG. 123; 148/DIG. 90; 148/DIG. 3; 156/603; 156/612; 156/DIG. 73; 156/DIG. 80; 427/53.1; 427/86
[58] Field of Search ........................ 148/1.5, 174, 175; 29/576 E, 576 T, 577 C, 578; 156/603, 612, DIG. 73, DIG. 80; 427/53.1, 86

[56] References Cited

U.S. PATENT DOCUMENTS

| | | | |
|---|---|---|---|
| 4,319,954 | 3/1982 | White et al. | 427/86 X |
| 4,323,417 | 4/1982 | Lam | 156/613 |
| 4,363,769 | 12/1982 | Tsuya et al. | 148/171 X |
| 4,381,201 | 4/1983 | Sakurai | 29/576 B X |
| 4,402,762 | 9/1983 | John et al. | 148/1.5 |
| 4,444,620 | 4/1984 | Kovacs et al. | 156/DIG. 70 |
| 4,487,639 | 12/1984 | Lam et al. | 148/175 |
| 4,497,683 | 2/1985 | Celler et al. | 156/603 |
| 4,498,951 | 2/1985 | Tamura et al. | 156/612 |
| 4,500,388 | 2/1985 | Ohmura et al. | 156/603 |

OTHER PUBLICATIONS

Roth et al., "Silicon Epitaxy by Solid-Phase Crystallization . . . Amorphous Films", *Applied Physics Letters*, vol. 31, No. 10, Nov. 15, 1977, pp. 689–691.

Ogirima et al., "Multiwafer Growth System for Low Pressure Silicon Epitaxy", *J. Electrochem. Soc.*, vol. 125, No. 11, Nov. 1978, pp. 1879–1881.

Bösch et al., "Crystallization of Amorphous Silicon on Silica . . . ", *Applied Physics Letters*, 40(2), Jan. 15, 1982, pp. 166–167.

Bean et al., "Epitaxial Laser Crystallization . . . Amorphous Silicon", *Appl. Phys. Lett.*, 33(3), Aug. 1, 1978, pp. 227–230.

Tsaur et al., "Epitaxial Alignment of Polycrystalline Si . . . ", *Appl. Phys. Lett.*, 37(7), Oct. 1, 1980, pp. 648–651.

Kinney et al., "Method for Producing Single Crystal Silicon . . . ", *I.B.M. Tech. Discl. Bull.*, vol. 24, No. 6, Nov. 1981, pp. 2955–2957.

*Primary Examiner*—William G. Saba
*Attorney, Agent, or Firm*—Antonelli, Terry & Wands

[57] ABSTRACT

An amorphous or polycrystalline film which continuously covers the exposed surface of a single crystal substrate and an insulating film, is deposited in ultra-high vacuum and then heat-treated. The film is subjected to solid phase epitaxial growth at a temperature far lower than in prior-art methods, whereby a single crystal film is formed.

8 Claims, 2 Drawing Figures ic devices that a single crystal film can be
METHOD OF PRODUCING SINGLE CRYSTAL FILM UTILIZING A TWO-STEP HEAT TREATMENT

BACKGROUND OF THE INVENTION

1. Field of the Invention

The present invention relates to a method of producing a single crystal film. More particularly, it relates to a method of forming a single crystal silicon film on an insulating film by a heat treatment of low temperature.

2. Description of the Prior Art

In the field of the production of semiconductor devices, there has heretofore been extensively employed a technique in which a material required for the formation of a single crystal film is transported onto the surface of a single crystal substrate, and the epitaxial growth is performed on the surface of the single crystal substrate, thereby to form the single crystal film.

On the other hand, the remarkable progress of various semiconductor devices in recent years has led to an eager request for a technique which can form a single crystal film, not only on the single crystal substrate, but also on an amorphous substance such as an insulating film.

As methods of forming a single crystal film on an insulating film, a large number of methods have been proposed. For example, a method has been proposed in which a polycrystalline or amorphous silicon film is irradiated with a powerful laser beam or electron beam to be turned into a single crystal.

With this method, the polycrystalline or amorphous silicon film deposited on an insulating film is melted by irradiating it with the laser beam or electron beam, and the single crystal film is formed on the insulating film by utilizing the liquid phase epitaxy or the grain growth which takes place in the course of the solidification of the melted silicon film.

In the growth of the single crystal film based on the irradiation with the laser beam or the electron beam, however, there are involved such numerous problems, which need to be solved, that the deposited film is deformed, that a strain develops in the deposited film due to a great heat gradient, that the growth conditions of the single crystal are limited, and that since impurity diffusion is caused in the active region of a device by a temperature rise in the vicinity of the melted area, a p-n junction is deformed, so the characteristics of the semiconductor device fluctuate.

On the other hand, a method has been proposed in which a film of a desired substance is deposited on the surface of a single crystal substrate in ultra-high vacuum on the order of, e.g., $10^{-7}$–$10^{-11}$ Torr, whereupon the resultant substrate is heated to turn the film of the substance into a single crystal by the solid phase epitaxial growth.

In this case, the temperature of the heat treatment which is conducted after the deposition of the film may be a comparatively low temperature, and it is said that the single crystal is grown at, for example, 600°–700° C. This method, however, consists in epitaxially growing the single crystal film on the single crystal substrate and does not refer at all to the growth of a single crystal on an amorphous substrate or amorphous film.

As is well known, it is an already established technique to form a single crystal film on a single crystal substrate by the epitaxial growth, and it is this method that has been in extensive practical use in the field of semiconductor device production.

The growth of a single crystal film on an insulator, however, is far more difficult than the growth on the single crystal substrate and has not been put into wide practical use yet.

Obviously, it is very useful in the field of semiconductor device production that a single crystal film can be formed on a film or substrate made of an amorphous substance such as insulator, especially at a comparatively low temperature. Nevertheless, such a method has not been established yet.

SUMMARY OF THE INVENTION

An object of the present invention is to solve the problems of the prior arts, and to provide a method which can grow a single crystal film on an insulating substrate without using a laser beam or an electron beam and by heat treatments at temperatures lower than in the prior arts.

Another object of the present invention is to provide a method which can form a single crystal film on an insulating film by the solid phase epitaxial growth of low temperature.

In order to accomplish the objects, according to the present invention, a polycrystalline or amorphous film is deposited in an ultra-high vacuum atmosphere (at approximately $10^{-7}$ Torr or below) in a manner to continuously cover the exposed surface of a single crystal substrate and an insulating film which is selectively deposited on desired parts of the substrate surface, whereupon a heat treatment of low temperature is conducted to turn the polycrystalline or amorphous film into a single crystal.

DETAILED DESCRIPTION OF THE PREFERRED EMBODIMENTS

Now, the present invention will be described in detail in conjunction with embodiments.

Figure 1:
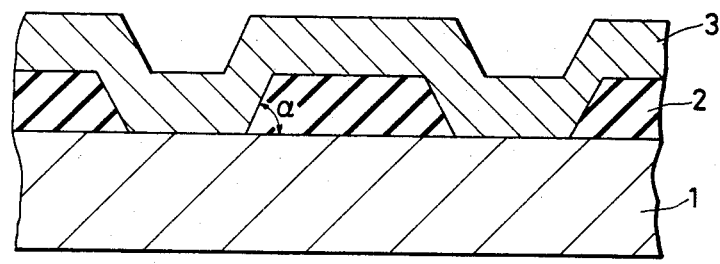
FIGS. 1 and 2 are diagrams for explaining the present invention.

As shown in FIG. 1, an $SiO_2$ film 2 is selectively deposited on desired parts of the surface of a single crystal silicon substrate 1, whereupon the resultant substrate is shifted into an ultra-high vacuum apparatus. The ultra-high vacuum apparatus is evacuated into a reduced pressure on the order of $10^{-7}$–$10^{-11}$ Torr, and an amorphous silicon film 3 is deposited on the whole areas of the silicon substrate 1 and the $SiO_2$ film 2 at the room temperature by the use of the well-known evaporation technique.

The resultant substrate is subjected to a first heat treatment while the degree of vacuum in the ultra-high vacuum apparatus is kept at the aforementioned value. Thereafter, the substrate is taken out of the ultra-high vacuum apparatus and is subjected to a second heat treatment by heating it again in a non-oxidizing atmosphere of, for example, nitrogen, helium or hydrogen.

In a case where the temperature of the first heat treatment which is performed in the ultra-high vacuum apparatus is below approximately 200° C., the amorphous silicon film does not become a single crystal uniformly, but polycrystalline grains are contained in a film obtained, even when the conditions of the second heat treatment which is performed in the atmosphere of nitrogen or the like are changed variously.

In contrast, in a case where the temperature of the first heat treatment is approximately 200° C. or above, for example, it is approximately 250° C., the amorphous silicon film is turned into the single crystal by the second heat treatment.

Figure 2:
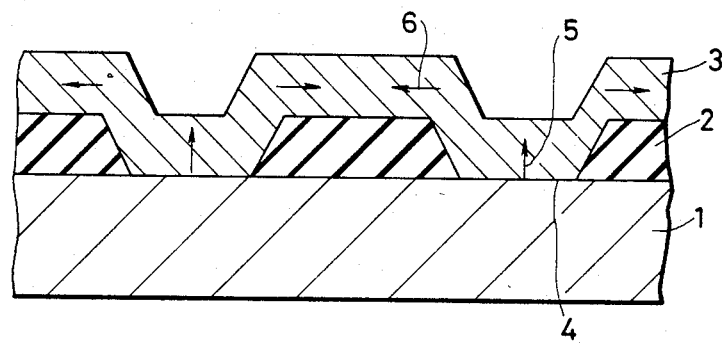

More specifically, the single-crystallization is not caused by the first heat treatment, but when the second heat treatment is conducted, the single-crystallization of the amorphous silicon film 3 arises successively from the parts thereof lying in contact with the exposed surface 4 of the single crystal silicon substrate 1, as illustrated in FIG. 2.

In this case, those parts of the amorphous silicon film 3 which are continuous to the exposed surface 4 of the single crystal silicon substrate 1 are first turned into the single crystal having the same crystal orientation as that of the silicon substrate 1, and the single-crystallization proceeds owing to the solid phase epitaxial growth in the vertical direction as indicated by arrows 5.

When the solid phase epitaxial growth in the vertical direction has ended, the solid phase epitaxial growth in the lateral direction is subsequently carried out as indicated by arrows 6, by employing as a seed the crystal produced by the preceding solid phase epitaxial growth, so that the parts of the amorphous silicon film 3 overlying the $SiO_2$ film 2 are also turned into the single crystal.

Regarding those parts of the amorphous silicon film 3 which are deposited on the $SiO_2$ film 2, the growth of crystal grains is noted to some extent in the course of the solid phase epitaxial growth in the vertical direction, but the single-crystallization proceeds slightly in that course.

The range in which the amorphous silicon film on the $SiO_2$ film can be turned into the single crystal, that is, the distance from each side end of the $SiO_2$ film 2 to the inner end of the corresponding single crystal film region obtained, is determined by the temperature and the period of time of the second heat treatment. By properly selecting the conditions of the heat treatment, accordingly, the single-crystallization can be effected a desired distance from each side end of the $SiO_2$ film 2.

Example:

As shown in FIG. 1, stripes of an $SiO_2$ film 2 each having a width of 1-20 $\mu$m and a thickness of 3000 Å were formed at intervals of 2 $\mu$m on the (100) plane of a single crystal silicon substrate 1 by the well-known thermal oxidation and photolithography. Thereafter, the resultant substrate was shifted into an ultra-high vacuum apparatus, the interior of which was evacuated to a degree of vacuum of $10^{-8}$-$10^{-9}$ Torr.

Using the known evaporation technique, an amorphous silicon film 3 was deposited on the whole surface of the substrate at the room temperature. Thereafter, while the degree of vacuum was kept at $10^{-8}$-$10^{-9}$ Torr, a heat treatment at 250° C. for 1 hour was carried out as the first heat treatment.

The first heat treatment is conducted in order to prevent the contamination of the substrate by the air when it is taken out of the vacuum apparatus so as to shift to the next step, and also to promote the single-crystallization. Preferably, the temperature of the heat temperature is set at approximately 200° C. or above.

When the treatment temperature is below approximately 200° C., it becomes difficult to uniformly turn the amorphous silicon film into the single crystal by the second heat treatment, as described before.

On the other hand, when it becomes approximately 800°-1000° C. or above, unfavorable influences on a p-n junction within the substrate, etc. become conspicuous. Therefore, it should preferably be avoided to set the temperature of the heat treatment within the vacuum apparatus at or above approximately 800°-1000° C.

In this regard, in a case where no p-n junction exists in the substrate, such fear as described above is not involved, and hence, the heat treatment temperature can be raised up to approximately 1100°-1200° C. At a temperature higher than these values, however, unfavorable phenomena including the damage of the apparatus might arise, so that a too high temperature should be avoided.

When the temperature of the heat treatment at the degree of vacuum of $10^{-8}$-$10^{-9}$ Torr is approximately 500° C. or above, the single-crystallization is executed by this heat treatment only. By setting the heat treatment temperature in this case at or above approximately 500° C., therefore, it is possible to omit the step of the second heat treatment which is conducted by taking the substrate out of the ultra-high vacuum apparatus.

However, it is somewhat troublesome and is often unsuitable for the mass production of semiconductor devices to heat-treat a silicon substrate of large diameter at a high temperature in the ultra-high vacuum apparatus so as to turn it into the single crystal. Moreover, the lowest possible heat treatment temperature is favorable for forming a semiconductor device of high packaging density at high precision.

For these reasons, it is more advantageous in practical use to set a low temperature (approximately 200°-500° C.) for the first heat treatment which is conducted in the ultra-high vacuum, and to effect the single-crystallization by the second heat treatment.

In the example, after the deposition of the amorphous silicon film 3 followed by the first heat treatment, the resultant silicon substrate was taken out of the ultra-high vacuum apparatus and was heat-treated in a dried nitrogen atmosphere at 650° C. for 30 minutes as the second heat treatment.

As a result, when the temperature of the first heat treatment in the ultra-high vacuum was below approximately 200° C. it was noted that the parts of the amorphous silicon film 3 deposited on the exposed surface 4 of the silicon substrate 1 were turned polycrystalline in the vicinities of the surface by the second heat treatment, and it was noted that the parts of the amorphous silicon film 3 deposited on the $SiO_2$ film 2 were similarly turned polycrystalline. Neither of the parts was the single crystal.

In contrast, when the temperature of the first heat treatment in the ultra-high vacuum was approximately 200° C. or above, it was noted that, not only the parts of the amorphous silicon film 3 deposited on the exposed surface 4 of the substrate, but also the parts deposited on the $SiO_2$ film 2 were grown into the (100)-oriented single crystal by the second heat treatment.

Herein, when the width of the stripe of the $SiO_2$ film 2 was approximately 6 $\mu$m or below, the part of the amorphous silicon film 3 on the $SiO_2$ film 2 was entirely turned into the single crystal, whereas when the width of the stripe of the $SiO_2$ film 2 was above approximately 6 $\mu$m, only regions each extending by 3 $\mu$m from the corresponding end of the $SiO_2$ film 2 were single-crystallized with an amorphous region remaining between the single-crystallized regions.

Accordingly, the growth rate of the solid phase epitaxy at 650° C. is approximately 1000 Å/minute in both the vertical direction and the lateral direction.

In addition, no great difference was noted between the characteristics of the single crystal silicon film parts which were respectively formed by the vertical growth and the lateral growth.

In order to increase the width of the single crystal region on the $SiO_2$ film, that is, the distance of the lateral growth 6, the temperature of the second heat treatment may be made higher, or the period of time thereof may be made longer. By way of example, when the heat-treating period of time was set at 100 minutes with the aforementioned growing temperature (650° C.), that amorphous silicon film on the $SiO_2$ film which had a width of 20 $\mu$m could be turned into the single crystal.

Preferably, the temperature of the second heat treatment is approximately 500° C. or above. Although the solid phase epitaxial growth is possible even at a temperature somewhat lower than 500° C., the period of time required for obtaining a desired single crystal film becomes conspicuously long, and hence, it is favorable in practical use to perform the growth at the temperature of or above approximately 500° C.

By way of example, the growth rate of single crystal silicon in the case of a heat treatment temperature of 500° C. is below approximately 10 Å/minute, and in order to turn amorphous silicon into the single crystal over a length of 1000 Å, a period of time of about 200 minutes is required including the required time for the vertical growth. However, when the heat treatment temperature is made 700° C., the growth rate of the single crystal becomes about 1 $\mu$m/minute. Therefore, in a case where the thickness of an amorphous silicon film is great, or where a single crystal silicon film of large area is to be formed on an insulating film, it is effective in practical use to make the heat treatment temperature high.

However, when a diffused layer or a p-n junction is included in the silicon substrate, an impurity already introduced in the silicon substrate is diffused by a heat treatment at a temperature of above approximately 800°–1000° C., to give rise to adverse effects. It is therefore preferable to set the heat treatment temperature at approximately 800°–1000° C. or below.

When the diffused layer or the p-n junction is not formed in the silicon substrate, the highest temperature of the second heat treatment can be made approximately 1100°–1200° C. for the same reason as in the case of the first heat treatment.

In order to obtain a single crystal film doped with an impurity, an amorphous or polycrystalline silicon film may be doped with the desired impurity in advance by ion implantation or thermal diffusion and subjected to the heat treatment so as to turn into the single crystal.

The single-crystallization rate of amorphous or polycrystalline silicon doped with an impurity is somewhat different from that in the case where the impurity is not contained. The growth rate of the single crystal may be found in advance as a function of the sort of the dopant impurity.

In the foregoing example, the $SiO_2$ film was used as the insulating film to be deposited on the substrate. Needless to say, however, the insulating film to which the present invention is applicable is not restricted to the $SiO_2$ film, but various insulating films, such as an $Si_3N_4$ film, used in the field of semiconductor devices are usable.

The reason why the amorphous or polycrystalline film is deposited on the substrate in the ultra-high vacuum in the present invention, is to reduce the mixing of an impurity, oxygen, water vapor etc. and the adsorption thereof on the substrate surface to the utmost, thereby permitting the solid phase epitaxial growth to proceed even at a low temperature without hindrance.

As stated before, the execution of the first heat treatment in the ultra-high vacuum is intended to prevent the contamination of the silicon substrate at the time at which the substrate has been taken out of the ultra-high vacuum apparatus in order to execute the second heat treatment, and also to facilitate the single crystal growth by the second heat treatment.

It is accordingly a matter of course that a lower pressure is more preferable as the internal pressure of the ultra-high vacuum apparatus at the times at which the amorphous or polycrystalline silicon film is formed and at which the first heat treatment is performed. In practical use, however, a pressure of or below approximately $10^{-7}$ Torr is enough to form a good single crystal film by the solid phase epitaxy even when the temperature of the second heat treatment is as low as approximately 500°–600° C.

As stated before, it is also possible to heat-treat the substrate without taking it out of the apparatus after the deposition of the amorphous or polycrystalline film and to perform the solid phase epitaxial growth in the ultra-high vacuum. Preferably, the heat treatment temperature in this case is set at approximately 500° C. to approximately 800°–1000° C. as described before. Needless to say, the second heat treatment which is executed by taking the substrate out of the ultra-high vacuum apparatus, and the heat treatment at or above approximately 200° C. can be omitted in this case.

The angle $\alpha$ (refer to FIG. 1) between the insulating film and the substrate surface is approximately 45° in ordinary cases, and when it is not greater than approximately 90°, the present invention can be performed without hindrance with no unfavorable influence exerted on the growth of the single crystal.

As set forth above, according to the present invention, the single crystal film extending from the exposed surface of the substrate onto the insulating film can be formed by the heat treatment at the temperature of or above approximately 500° C. which is much lower than in the prior art. It has heretofore been impossible to grow the single crystal silicon at such low temperature, and it is the great feature of the present invention not found in any prior-art method of growing the single crystal.

Owing to the low treatment temperature, even when an impurity-doped layer or a p-n junction is included in the silicon substrate, it is not feared to change in shape or dimensions at the step of forming the single crystal film.

In addition, after an impurity-doped layer has been formed in the single crystal film obtained in accordance with the present invention, an insulating layer having one or more openings can be stacked thereon and overlaid with a further single crystal film according to the present invention. The present invention therefore makes it possible to form a semiconductor device of novel structure having heretofore been difficult. The invention brings forth such great advantages.

What is claimed is:

1. A method of producing a single crystal film, comprising:
   (1) the step of depositing an insulating film which has a desired plane shape, on a surface of a single crystal substrate, In contrast, in a case where the temperature of the first heat treatment is approximately 200° C. or above, for example, it is approximately 250° C., the amorphous silicon film is turned into the single crystal by the second heat treatment.

More specifically, the single-crystallization is not caused by the first heat treatment, but when the second heat treatment is conducted, the single-crystallization of the amorphous silicon film 3 arises successively from the parts thereof lying in contact with the exposed surface 4 of the single crystal silicon substrate 1, as illustrated in FIG. 2.

In this case, those parts of the amorphous silicon film 3 which are continuous to the exposed surface 4 of the single crystal silicon substrate 1 are first turned into the single crystal having the same crystal orientation as that of the silicon substrate 1, and the single-crystallization proceeds owing to the solid phase epitaxial growth in the vertical direction as indicated by arrows 5.

When the solid phase epitaxial growth in the vertical direction has ended, the solid phase epitaxial growth in the lateral direction is subsequently carried out as indicated by arrows 6, by employing as a seed the crystal produced by the preceding solid phase epitaxial growth, so that the parts of the amorphous silicon film 3 overlying the $SiO_2$ film 2 are also turned into the single crystal.

Regarding those parts of the amorphous silicon film 3 which are deposited on the $SiO_2$ film 2, the growth of crystal grains is noted to some extent in the course of the solid phase epitaxial growth in the vertical direction, but the single-crystallization proceeds slightly in that course.

The range in which the amorphous silicon film on the $SiO_2$ film can be turned into the single crystal, that is, the distance from each side end of the $SiO_2$ film 2 to the inner end of the corresponding single crystal film region obtained, is determined by the temperature and the period of time of the second heat treatment. By properly selecting the conditions of the heat treatment, accordingly, the single-crystallization can be effected a desired distance from each side end of the $SiO_2$ film 2.

Example:

As shown in FIG. 1, stripes of an $SiO_2$ film 2 each having a width of 1-20 $\mu$m and a thickness of 3000 Å were formed at intervals of 2 $\mu$m on the (100) plane of a single crystal silicon substrate 1 by the well-known thermal oxidation and photolithography. Thereafter, the resultant substrate was shifted into an ultra-high vacuum apparatus, the interior of which was evacuated to a degree of vacuum of $10^{-8}$-$10^{-9}$ Torr.

Using the known evaporation technique, an amorphous silicon film 3 was deposited on the whole surface of the substrate at the room temperature. Thereafter, while the degree of vacuum was kept at $10^{-8}$-$10^{-9}$ Torr, a heat treatment at 250° C. for 1 hour was carried out as the first heat treatment.

The first heat treatment is conducted in order to prevent the contamination of the substrate by the air when it is taken out of the vacuum apparatus so as to shift to the next step, and also to promote the single-crystallization. Preferably, the temperature of the heat temperature is set at approximately 200° C. or above.

When the treatment temperature is below approximately 200° C., it becomes difficult to uniformly turn the amorphous silicon film into the single crystal by the second heat treatment, as described before.

On the other hand, when it becomes approximately 800°-1000° C. or above, unfavorable influences on a p-n junction within the substrate, etc. become conspicuous. Therefore, it should preferably be avoided to set the temperature of the heat treatment within the vacuum apparatus at or above approximately 800°-1000° C.

In this regard, in a case where no p-n junction exists in the substrate, such fear as described above is not involved, and hence, the heat treatment temperature can be raised up to approximately 1100°-1200° C. At a temperature higher than these values, however, unfavorable phenomena including the damage of the apparatus might arise, so that a too high temperature should be avoided.

When the temperature of the heat treatment at the degree of vacuum of $10^{-8}$-$10^{-9}$ Torr is approximately 500° C. or above, the single-crystallization is executed by this heat treatment only. By setting the heat treatment temperature in this case at or above approximately 500° C., therefore, it is possible to omit the step of the second heat treatment which is conducted by taking the substrate out of the ultra-high vacuum apparatus.

However, it is somewhat troublesome and is often unsuitable for the mass production of semiconductor devices to heat-treat a silicon substrate of large diameter at a high temperature in the ultra-high vacuum apparatus so as to turn it into the single crystal. Moreover, the lowest possible heat treatment temperature is favorable for forming a semiconductor device of high packaging density at high precision.

For these reasons, it is more advantageous in practical use to set a low temperature (approximately 200°-500° C.) for the first heat treatment which is conducted in the ultra-high vacuum, and to effect the single-crystallization by the second heat treatment.

In the example, after the deposition of the amorphous silicon film 3 followed by the first heat treatment, the resultant silicon substrate was taken out of the ultra-high vacuum apparatus and was heat-treated in a dried nitrogen atmosphere at 650° C. for 30 minutes as the second heat treatment.

As a result, when the temperature of the first heat treatment in the ultra-high vacuum was below approximately 200° C. it was noted that the parts of the amorphous silicon film 3 deposited on the exposed surface 4 of the silicon substrate 1 were turned polycrystalline in the vicinities of the surface by the second heat treatment, and it was noted that the parts of the amorphous silicon film 3 deposited on the $SiO_2$ film 2 were similarly turned polycrystalline. Neither of the parts was the single crystal.

In contrast, when the temperature of the first heat treatment in the ultra-high vacuum was approximately 200° C. or above, it was noted that, not only the parts of the amorphous silicon film 3 deposited on the exposed surface 4 of the substrate, but also the parts deposited on the $SiO_2$ film 2 were grown into the (100)-oriented single crystal by the second heat treatment.

Herein, when the width of the stripe of the $SiO_2$ film 2 was approximately 6 $\mu$m or below, the part of the amorphous silicon film 3 on the $SiO_2$ film 2 was entirely turned into the single crystal, whereas when the width of the stripe of the $SiO_2$ film 2 was above approximately 6 $\mu$m, only regions each extending by 3 $\mu$m from the corresponding end of the $SiO_2$ film 2 were single-crystallized with an amorphous region remaining between the single-crystallized regions.

Accordingly, the growth rate of the solid phase epitaxy at 650° C. is approximately 1000 Å/minute in both the vertical direction and the lateral direction.

(2) the step of depositing an amorphous or polycrystalline film in an atmosphere of ultra-high vacuum, said film continuously covering exposed surface parts of said single crystal substrate and said insulating film, and (3) the step of turning said amorphous or polycrystalline film into a single crystal by solid phase epitaxial growth, said step of turning including a first heat treatment, at a temperature of not lower than approximately 200° C., which is conducted in the ultra-high vacuum atmosphere, and a second heat treatment, at a temperature of approximately 500°–1000° C., which is conducted in a non-oxidizing atmosphere.

2. A method of producing a single crystal film, comprising:

(1) the step of depositing an insulating film which has a desired plane shape, on a surface of a single crystal substrate, (2) the step of depositing an amorphous or polycrystalline film in an atmosphere of ultra-high vacuum, said film continuously covering exposed surface parts of said single crystal substrate and said insulating film, and (3) the step of turning said amorphous or polycrystalline film into a single crystal by solid phase epitaxial growth, said step of turning including a first heat treatment, at a temperature of not lower than approximately 200° C., which is conducted in the ultra-high vacuum atmosphere, and a second heat treatment, at a temperature of approximately 500°–1200° C., which is conducted in a non-oxidizing atmosphere.

3. A method of producing a single crystal film according to claim 1 or 2, wherein the ultra-high vacuum for said step of depositing and the ultra-high vacuum for the heat treatment each have an air pressure of not higher than approximately $10^{-7}$ Torr.

4. A method of producing a single crystal film according to claim 3, wherein said air pressure for the ultra-high vacuum of the depositing step and the heat treatment is $10^{-7}$–$10^{-11}$ Torr.

5. A method of producing a single crystal film according to claim 1, wherein the substrate is a semiconductor substrate containing p-n junctions.

6. A method of producing a single crystal film according to claim 1 or 2, wherein the temperature of the first heat treatment is 200°–500° C.

7. A method of producing a single crystal film according to claim 1, wherein the angle between the insulating film and the substrate is at most 90°.

8. A method of producing a single crystal film according to claim 1 or 2, wherein after the step of turning the amorphous or polycrystalline film into a single crystal, performing the further steps comprising:

(4) depositing a further insulating film, having a desired plane shape, on the surface of said single crystal;

(5) depositing a further amorphous or polycrystalline film in an atmosphere of ultra-high vacuum, said film continuously covering exposed surface parts of the single crystal and the further insulating film; and (6) turning the further amorphous or polycrystalline film into a further single crystal by solid phase epitaxial growth, the turning the further film including a first heat treatment, at a temperature of not lower than approximately 200° C., which is conducted in the ultra-high vacuum atmosphere, and a second heat treatment, at a temperature of approximately 500°–1000° C., which is conducted in a non-oxidizing atmosphere.

* * * * *